US011955577B2

(12) United States Patent
Beckett et al.

(10) Patent No.: US 11,955,577 B2
(45) Date of Patent: Apr. 9, 2024

(54) MULTI-OPERATION TOOL FOR PHOTOVOLTAIC CELL PROCESSING

(71) Applicant: Maxeon Solar Pte. Ltd., Singapore (SG)

(72) Inventors: Nathan Phillips Beckett, Oakland, CA (US); Gilad Almogy, Palo Alto, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 883 days.

(21) Appl. No.: 17/011,707

(22) Filed: Sep. 3, 2020

(65) Prior Publication Data

US 2020/0403113 A1    Dec. 24, 2020

Related U.S. Application Data

(63) Continuation of application No. 15/365,762, filed on Nov. 30, 2016, now Pat. No. 10,804,422.
(Continued)

(51) Int. Cl.
*H01L 31/18* (2006.01)
*B41F 15/08* (2006.01)
(Continued)

(52) U.S. Cl.
CPC ...... *H01L 31/1876* (2013.01); *B41F 15/0881* (2013.01); *H01L 21/67092* (2013.01);
(Continued)

(58) Field of Classification Search
CPC .......... H01L 31/1876; H01L 21/67092; H01L 21/67109; H01L 21/67207;
(Continued)

(56) References Cited

U.S. PATENT DOCUMENTS 6,620,374 B2    9/2003    Stefanac et al.
7,592,201 B2    9/2009    Young et al.
(Continued)

FOREIGN PATENT DOCUMENTS

CN    201323206    10/2009
CN    201402815    2/2010
(Continued)

OTHER PUBLICATIONS

First Action Interview Pilot Program Pre-Interview Communication from U.S. Appl. No. 15/365,762 dated Jan. 18, 2019, 8 pgs.
(Continued)

*Primary Examiner* — Robert G Bachner
(74) *Attorney, Agent, or Firm* — Schwabe, Williamson & Wyatt, P.C.

(57) ABSTRACT

Multi-operation tools for photovoltaic cell processing are described. In an example, a multi-operation tool includes a conveyor system to move a photovoltaic (PV) cell continuously along a conveyor path through a laser scribing station and an adhesive printing station. Furthermore, the PV cell may be aligned to a laser head of the laser scribing station and a printer head of the adhesive printing station in a single alignment operation prior to being laser scribed and printed with an adhesive in a continuous process.

19 Claims, 13 Drawing Sheets

Related U.S. Application Data

(60) Provisional application No. 62/261,727, filed on Dec. 1, 2015.

(51) Int. Cl.
  *H01L 21/67* (2006.01)
  *H01L 21/677* (2006.01)
  *H01L 31/042* (2014.01)
  *H01L 31/05* (2014.01)

(52) U.S. Cl.
  CPC .. *H01L 21/67109* (2013.01); *H01L 21/67207* (2013.01); *H01L 21/67282* (2013.01); *H01L 21/6776* (2013.01); *H01L 31/042* (2013.01); *H01L 31/0504* (2013.01); *H01L 31/18* (2013.01); *H01L 31/188* (2013.01); *Y02E 10/50* (2013.01); *Y02P 70/50* (2015.11)

(58) Field of Classification Search
  CPC ........... H01L 21/67282; H01L 21/6776; H01L 31/042; H01L 31/0504; H01L 31/18; H01L 31/188; B41F 15/0881; Y02E 10/50; Y02P 70/50
  See application file for complete search history.

(56) References Cited

U.S. PATENT DOCUMENTS

| | | |
|---|---|---|
| 8,024,854 B2 | 9/2011 | Lu et al. |
| 8,225,496 B2 | 7/2012 | Bachrach et al. |
| 8,227,723 B2 | 7/2012 | Benson et al. |
| 8,975,510 B2 | 3/2015 | Coakley |
| 9,716,467 B2 | 7/2017 | Spotti |
| 9,773,691 B2 | 9/2017 | Bando et al. |
| 2005/0217718 A1 | 10/2005 | Dings et al. |
| 2006/0213548 A1 | 9/2006 | Bachrach et al. |
| 2009/0221217 A1 | 9/2009 | Gajaria et al. |
| 2010/0047954 A1 | 2/2010 | Su et al. |
| 2011/0256377 A1 | 10/2011 | Chiruvolu et al. |
| 2012/0224656 A1* | 9/2012 | Aoki ................ H04L 25/0274 375/316 |
| 2012/0244656 A1 | 9/2012 | Kim et al. |
| 2013/0112233 A1 | 5/2013 | Coakley |
| 2013/0122639 A1 | 5/2013 | Degroot et al. |
| 2014/0224773 A1 | 8/2014 | Murata et al. |
| 2016/0163907 A1 | 6/2016 | Gonzalez et al. |
| 2016/0163912 A1* | 6/2016 | Gonzalez ............ B05C 11/1023 118/712 |

FOREIGN PATENT DOCUMENTS

| | | |
|---|---|---|
| CN | 102694065 | 9/2012 |
| CN | 104112792 | 10/2014 |
| JP | H1179770 | 3/1999 |
| JP | 2007234720 A | 9/2007 |
| TW | 201332871 | 8/2013 |

OTHER PUBLICATIONS

Final Office Action from U.S. Appl. No. 15/365,762 dated May 1, 2019, 18 pgs.
Non-Final Office Action from U.S. Appl. No. 15/365,762 dated Dec. 31, 2019, 14 pgs.
PCT International Search Report And Written Opinion from PCT Application No. PCT/US2016/064497 dated Feb. 28, 2017, 11 pgs.
International Preliminary Report on Patentability from PCT Application No. PCT/US2016/064497 dated Jun. 14, 2018, 7 pgs.
First Office Action from Chinese Patent Application No. 2016800696744 dated Jun. 3, 2021, 11 pgs.

* cited by examiner

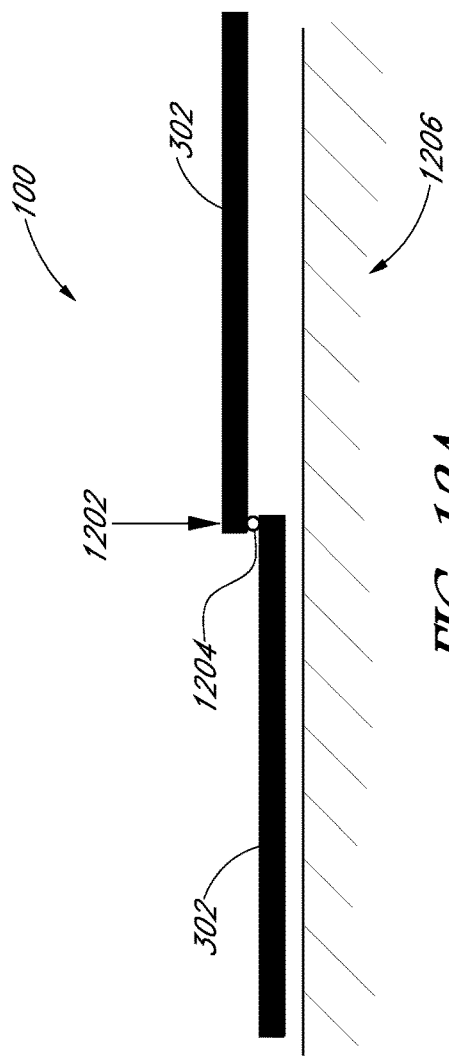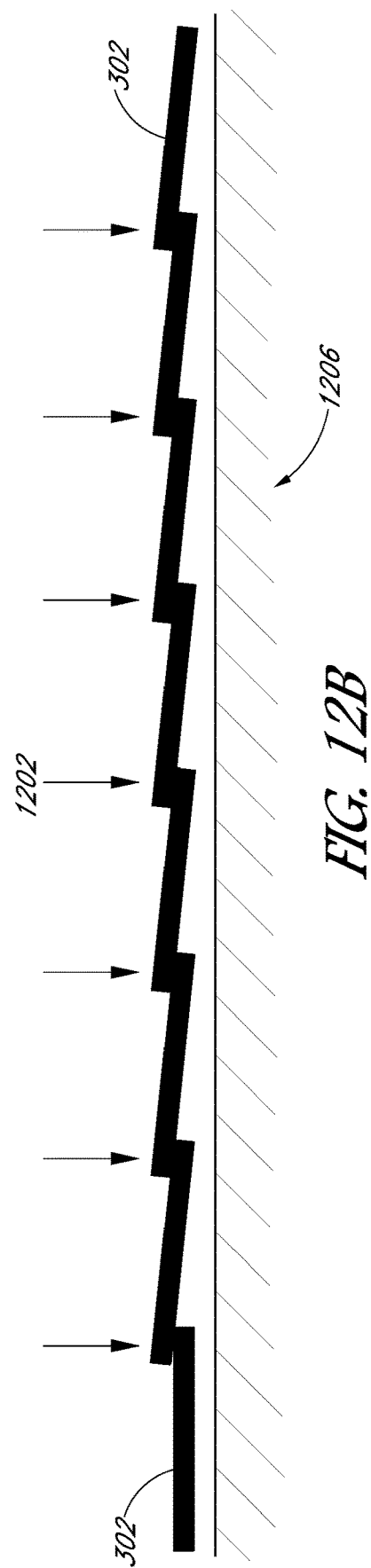

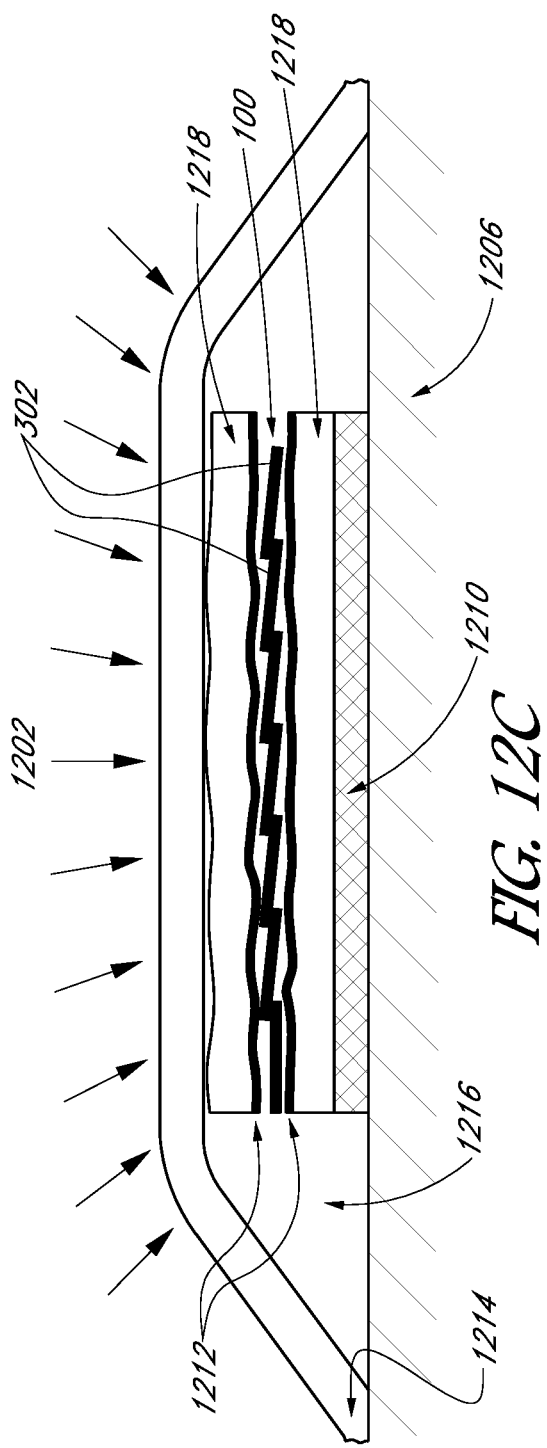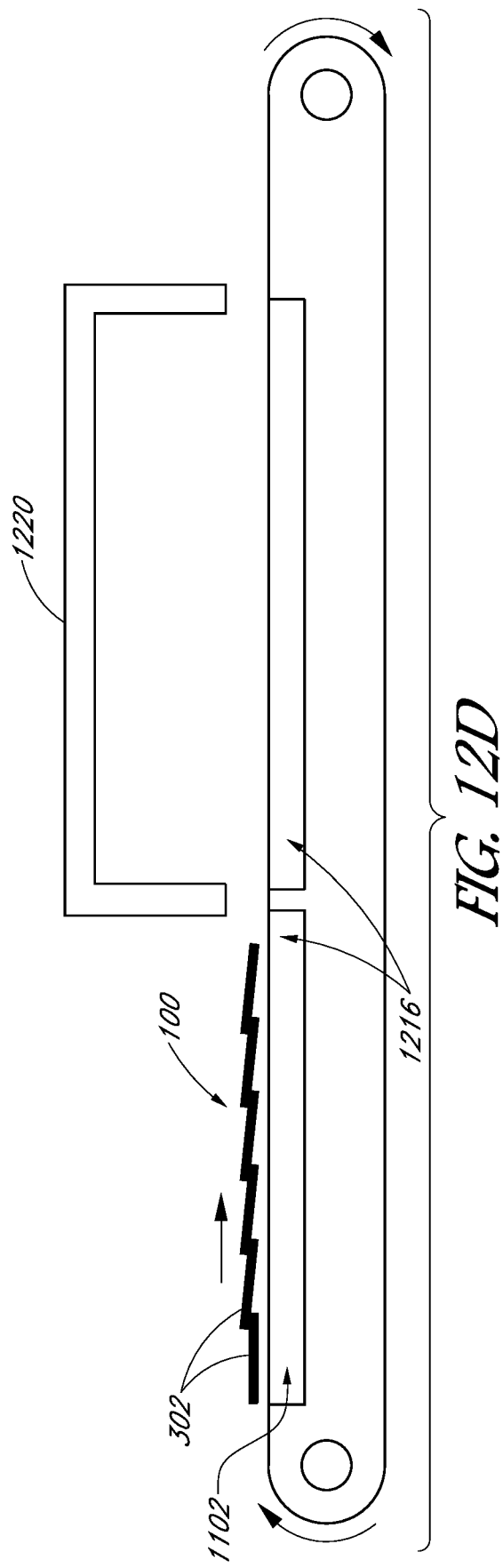

MULTI-OPERATION TOOL FOR PHOTOVOLTAIC CELL PROCESSING

RELATED APPLICATIONS

This application is a continuation of U.S. patent application Ser. No. 15/365,762 filed Nov. 30, 2016, which claims the benefit of priority from U.S. Provisional Application No. 62/261,727 filed Dec. 1, 2015, the entire contents of which are hereby incorporated by reference herein.

This invention was made with government support under DE-EE0007190 awarded by the United States Department of Energy. The government has certain rights in the invention.

BACKGROUND

Photovoltaic (PV) cells, commonly known as solar cells, are well known devices for converting solar radiation into electrical energy. PV cells can be assembled into PV panels, which can be used to convert sunlight into electricity. The electricity produced by the PV panels can be transmitted by cables for residential and/or commercial use.

Numerous processes can be used during the fabrication of PV cells, including laser cutting and bonding operations. Such operations are ordinarily performed sequentially by different tools. For example, a PV cell can undergo a laser cutting process in a laser tool, and then be removed from the laser tool and loaded into a bonding tool to undergo a bonding process.

BRIEF DESCRIPTION OF THE DRAWINGS

The present invention is illustrated by way of example and not limitation in the figures of the accompanying drawings in which like references indicate similar elements.

FIGS. 12A-12D illustrate example arrangements by which super cells can be cured with heat and pressure.

DETAILED DESCRIPTION

Figure 1:
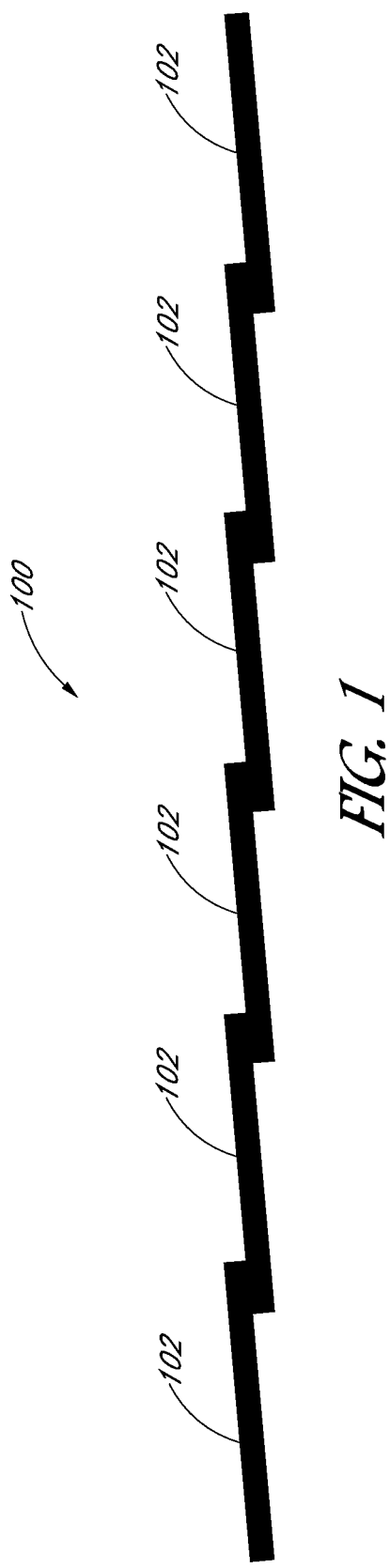
FIG. 1 illustrates a side view of a photovoltaic (PV) "super" cell.

Multi-operation tools and methods of manufacturing photovoltaic (PV) cells are described herein. The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" location does not necessarily imply that this location is the first location in a sequence; instead the term "first" is used to differentiate this location from another location (e.g., a "second" location).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper," "lower," "above," "below," "in front of," and "behind" refer to directions in the drawings to which reference is made. Terms such as "front," "back," "rear," "side," "outboard," "inboard," "leftward," and "rightward" describe the orientation and/or location of portions of a component, or describe the relative orientation and/or location between components, within a consistent but arbitrary frame of reference which is made clear by reference to the text and the associated drawings describing the component(s) under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it can completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

By way of background, referring to FIG. 1, a PV "super" cell is illustrated. A super cell 100 can include several adjacent solar cells 102 conductively bonded to each other in an overlap region by an electrically conducting bonding material or an adhesive that electrically connects the front surface metallization pattern of one solar cell 102 to the rear surface metallization pattern of an adjacent solar cell 102. Suitable electrically conducting bonding materials can include, for example, electrically conducting adhesives and electrically conducting adhesive films and adhesive tapes, and conventional solders. The electrically conducting bonding material provides mechanical compliance in the bond between the adjacent solar cells 102 that accommodates stress arising from mismatch between the coefficient of thermal expansion of the electrically conducting bonding material and that of the solar cells 102. Thus, the bond joint can be resilient to accommodate environmental temperature shifts occurring after deployment at an installation site.

Figure 2:
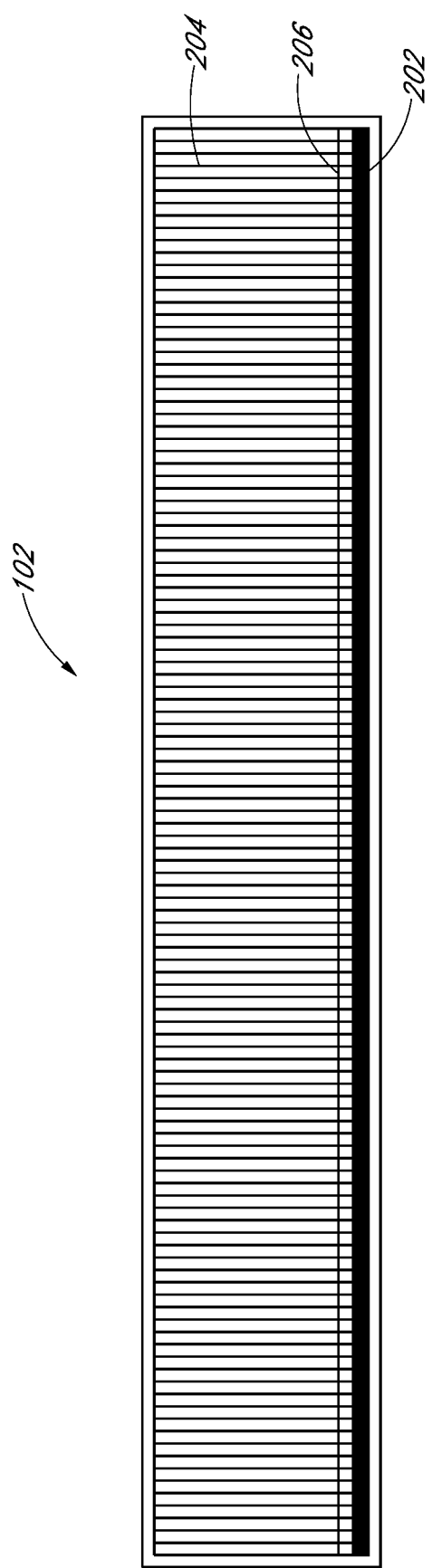
FIG. 2 illustrates a top view of a solar cell that can be used in a super cell.

Referring to FIG. 2, a front or top surface of a rectangular solar cell that can be used in a super cell is illustrated. Other shapes for solar cell 102 can also be used. A front surface metallization pattern of solar cell 102 can include a bus bar 202 positioned adjacent to the edge of one of the long sides of solar cell 102 and running parallel to the long sides for substantially the length of the long sides. Fingers 204 can be attached perpendicularly to the bus bar 202 and run parallel to each other and to the short sides of solar cell 102 for substantially the length of the short sides. Optionally, the front surface metallization pattern on the solar cell 102 includes a bypass conductor 206 running parallel to, and spaced apart from, the bus bar 202. The bypass conductor 206 interconnects the fingers 204 to electrically bypass cracks that can form between the bus bar 202 and the bypass conductor 206. Such cracks, which can sever the fingers 204 at locations near to the bus bar 202, can otherwise isolate regions of the solar cell 102 from the bus bar 202. The bypass conductor 206 provides an alternative electrical path between such severed fingers 204 and the bus bar 202. The illustrated example shows the bypass conductor 206 positioned parallel to the bus bar 202, extending about the full length of the bus bar 202, and interconnecting every finger 204.

Also by way of background, a method of fabricating a super cell 100 can include several operations. For example, the method can include laser scribing one or more scribe lines on each of one or more silicon solar cells 102 to define several rectangular regions on the silicon solar cells 102. The method can include applying an electrically conductive adhesive bonding material to the one or more scribed silicon solar cells 102 at one or more locations adjacent a long side of each rectangular region. Optionally, the electrically conductive adhesive bonding material can be applied to portions of the top surfaces of the one or more silicon solar cells 102. The silicon solar cells 102 can be separated along the scribe lines to provide several rectangular silicon solar cells 102, each having a portion of the electrically conductive adhesive bonding material disposed on a respective front surface adjacent to a respective long side. Optionally, the separation can be performed by applying a vacuum between the bottom surfaces of the one or more silicon solar cells 102 and a curved supporting surface to flex the one or more silicon solar cells 102 against the curved supporting surface and thereby cleave the one or more silicon solar cells 102 along the scribe lines. The rectangular silicon solar cells 102 can be arranged in line with the long sides of adjacent rectangular silicon solar cells 102 overlapping in a shingled manner with a portion of the electrically conductive adhesive bonding material disposed in between. The electrically conductive bonding material can then be cured to bond adjacent overlapping rectangular silicon solar cells 102 to each other and electrically connect them in series to form a super cell 100.

The operations performed in the method described above can be performed separately by different tools. For example, laser scribing of the solar cells 102 can be performed by a laser tool located at one position on a manufacturing floor, and application of the electrically conductive adhesive can be performed by an applicator at a different position on the manufacturing floor. The laser tool and the applicator can be physically uncoupled in that the solar cell 102 can be carried by an operator from the laser tool to the applicator to perform each of the operations. Accordingly, sub-operations such as aligning the solar cell 102 to the laser tool and the applicator may be duplicated, which requires time. Furthermore, a distance between the laser tool and the applicator uses valuable manufacturing floor footprint. The operator must also handle the photocell after laser scribing, which can lead to premature separation of the solar cell 102 along the scribe lines and concomitant reduction in manufacturing yields (and increased costs).

In an aspect, a multi-operation tool combines a laser scribing station and an adhesive printing station in a single apparatus. More particularly, the laser scribing station can include a lasing location to scribe a PV cell and the adhesive printing station can include a printing location to apply an electrically conductive adhesive to the PV cell during a single, continuous process. The PV cell can be loaded and/or aligned once on a conveyor system of the multi-operation tool. The conveyor system can then move a cell platform supporting the PV cell along a continuous conveyor path. As the PV cell travels along the continuous conveyor path it can pass through the laser station to be laser scribed and through the adhesive printing station to receive electrically conductive adhesive. The multi-operation tool can require less space than the use of a laser tool physically uncoupled from an applicator, and thus, the multi-operation tool can reduce the manufacturing floor footprint. Furthermore, handling of the PV cell by an operator is unnecessary when transferring the PV cell from the laser scribing station to the adhesive printing station, and thus, a likelihood of breaking the PV cell can be reduced. Manufacturing yields can improve accordingly through the use of the multi-operation tool.

The aspects described above can be realized by the multi-operation tool and methods disclosed herein. In the following description, numerous specific details are set forth, such as specific material regimes and component structures, in order to provide a thorough understanding of embodiments of the present disclosure. It will be apparent to one skilled in the art that embodiments of the present disclosure can be practiced without these specific details. In other instances, well-known fabrication techniques or component structures, such as specific types of welding or riveting processes, are not described in detail in order to not unnecessarily obscure embodiments of the present disclosure. Furthermore, it is to be understood that the various embodiments shown in the figures are illustrative representations and are not necessarily drawn to scale.

By way of summary, disclosed herein is a multi-operation tool for laser scribing and applying an adhesive to a PV cell.

In an embodiment, a multi-operation tool includes a laser scribing station having a laser head over a lasing location. The multi-operation tool can also include an adhesive printing station having a printer head over a printing location. A conveyor system having a cell platform and an actuator can operate to move the cell platform through the laser scribing station and the adhesive printing station. More particularly, the actuator can be operably coupled to the cell platform to move the cell platform along a conveyor path from a loading location to the same loading location, e.g., continuously along a perimeter of a circular path. Thus, the conveyor path can extend continuously through the loading location, the lasing location, and the printing location such that the cell platform can carry a PV cell in a circuit from the loading position to an unloading station and back to the loading position without reversing directions.

Also by way of summary, in an embodiment, a method includes loading a PV cell on a cell platform of a conveyor system of a multi-operation tool. The conveyor system can include an actuator operably coupled to the cell platform to move the cell platform along a conveyor path from a loading location to the same loading location, e.g., along a perimeter of a circular path. The method can include moving the cell platform along the conveyor path from the loading location to a lasing location. The lasing location can be under a laser head of a laser scribing station of the multi-operation tool, and thus, the laser head can laser scribe a scribe line on a surface of the PV cell as the PV cell travels through the laser scribing station along the conveyor path. The method can include moving the cell platform along the conveyor path from the lasing location to a printing location. The printing location can be under a printer head of an adhesive printing station of the multi-operation tool, and thus, the printer head can apply an adhesive on the surface of the PV cell as the PV cell travels through the adhesive printing station along the conveyor path.

Figure 3:
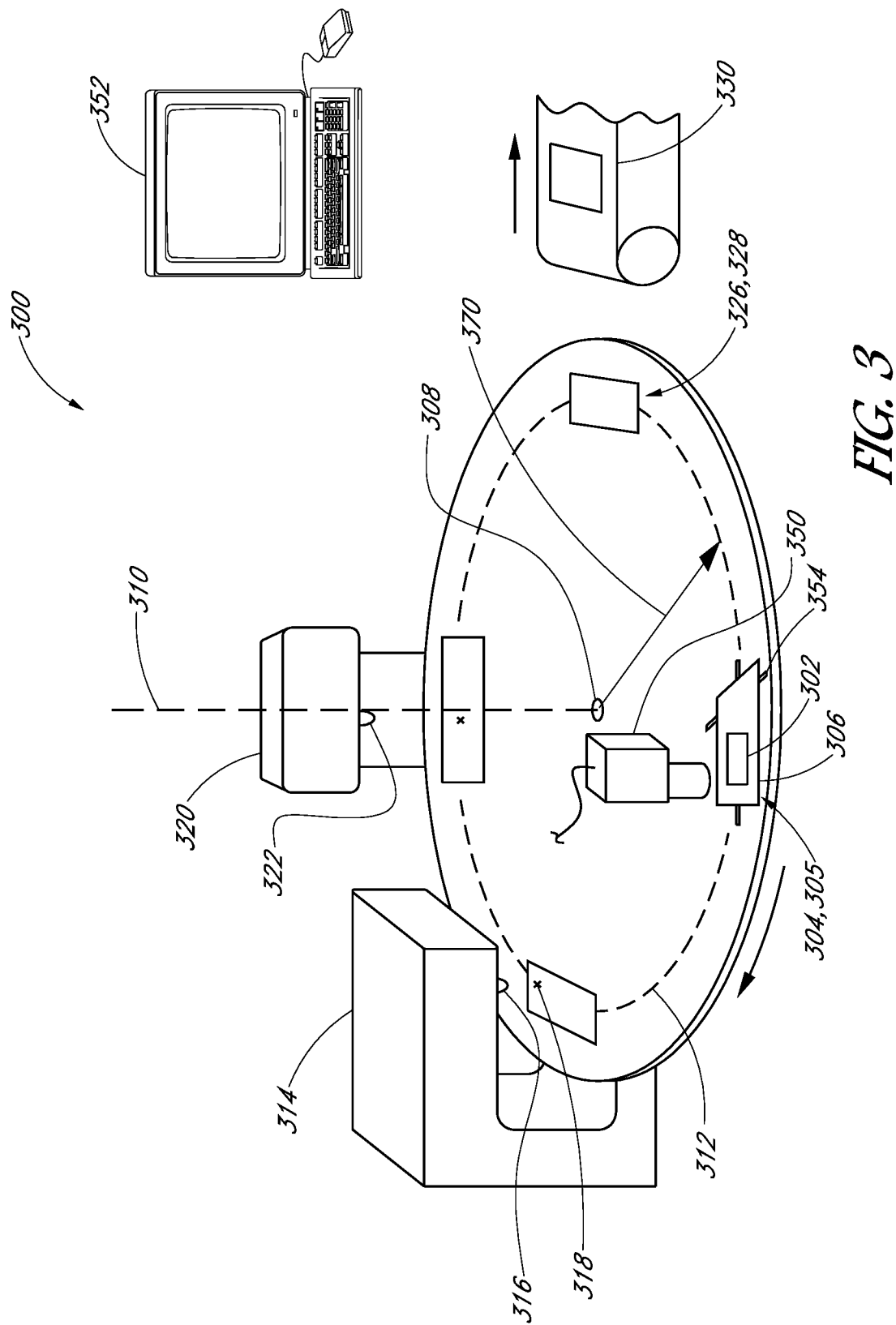
FIG. 3 illustrates a perspective view of a multi-operation tool.

Referring to FIG. 3, a perspective view of a multi-operation tool is illustrated. A multi-operation tool 300 can combine several functionalities, e.g., laser scribing functionality and adhesive printing functionality, to process a PV cell 302 as the PV cell 302 is moved along a continuous path. Accordingly, the multi-operation tool 300 can include several stations positioned along the continuous path to receive and process the PV cell 302 as it moves through the multi-operation tool 300.

In an embodiment, the multi-operation tool 300 includes a loading station 304. The loading station 304 can be a predetermined space, e.g., a controlled-environment hood, having a loading location 305 at which the PV cell 302 can be input to the multi-operation tool 300. The PV cell 302 can be placed at the loading location 305 manually by an operator. In an embodiment, an automated placement unit, such as a conveyor belt or a robotic arm, can carry the PV cell 302 from another location within the manufacturing facility to the loading location 305.

The loading location 305 can be a location on a conveyor system of the multi-operation tool 300. The multi-operation tool 300 can include the conveyor system to move the PV cell 302 from the loading location 305 through one or more stations of the multi-operation tool 300 to an unloading station 328 of the multi-operation tool 300. The conveyor system can include a cell platform 306 on which the PV cell 302 can be placed. For example, the cell platform 306 can include a flat surface to receive the PV cell 302. The PV cell 302 can remain in place on the cell platform 306 under its own weight. The cell platform 306 can, however, include a gripping mechanism to secure the PV cell 302 to the flat surface. For example, the cell platform 306 can include a chuck, such as a vacuum, electrostatic, or mechanical chuck, to grip the PV cell 302.

The cell platform 306 of the conveyor system can be moved along the continuous path through the stations of multi-operation tool 300. Accordingly, the conveyor system can include an actuator to move the cell platform 306 along a conveyor path 312 from the loading location 305 through the stations of the multi-operation tool 300. For example, the actuator can be a rotary actuator 308 such as a rotational stepper motor or a linkage system configured to cause rotation of a transmission shaft about an axis 310. Accordingly, the conveyor system can include a rotary stage system. The actuator can be operably connected to the cell platform 306 to rotate the cell platform 306 about the axis 310. For example, rotary actuator 308 can be connected to cell platform 306 by a radially oriented arm, a table platform, or another linkage such that actuation of the linkage by the rotary actuator 308 causes the cell platform 306 to move along the conveyor path 312 from the loading location 305. The rotary actuator 308 can apply a continuous torque to move the linkage continuously in the same rotational direction, and thus, the cell platform 306 can move along the conveyor path 312 from the loading location 305 in a continuous circuit that returns to the loading location 305. Accordingly, the cell platform 306 can travel along the conveyor path 312 continuously through the stations positioned along the conveyor path 312 of the multi-operation tool 300.

The conveyor path 312 can extend continuously through each of the stations of multi-operation tool 300. For example, the conveyor path 312 can begin at the loading location 305 of the loading station 304, and extend around the axis 310 through a lasing location 318 within a laser scribing station 314, and through a printing location 324 within an adhesive printing station 320. As described below, the multi-operation tool 300 can include any number of processing stations, and thus, the conveyor path 312 can extend through each station such that the cell platform 306 carries the PV cell 302 along the conveyor path 312 to be processed at each of the stations.

The multi-operation tool 300 can include the laser scribing station 314. The laser scribing station 314 can include a laser head 316 for directing a laser beam toward the lasing location 318. For example, the laser head 316 can be located over the lasing location 318 to direct the laser beam downward toward a PV cell 302 as the PV cell 302 passes through the laser scribing station 314. Additional details related to the laser scribing station 314 and the process of laser scribing the PV cell 302 are described further below (e.g., FIG. 4).

The multi-operation tool 300 can include the adhesive printing station 320 positioned along the conveyor path 312. The adhesive printing station 320 can include a printer head 322 for directing an adhesive, e.g., an electrically conductive adhesive, toward the printing location 324. For example, the printer head 322 can be located over the printing location 324 to direct the adhesive downward toward a PV cell 302 as the PV cell 302 passes through the adhesive printing station 320. Additional details related to the adhesive printing station 320 and the process of applying the adhesive to the PV cell 302 are described further below (e.g., FIG. 4).

The multi-operation tool 300 can include one or more of an inspection station 326 or an unloading station 328 positioned along the conveyor path 312 after the laser scribing station 314 and the adhesive printing station 320. More particularly, the PV cell 302 can travel along the conveyor path 312 from the loading station 304 through the laser scribing station 314 and the adhesive printing station 320 to the inspection station 326 and/or the unloading station 328. In an embodiment, the inspection station 326 includes an imaging system, e.g., a camera, to view and inspect the processed PV cell 302 manually or automatically. The unloading station 328 can be, for example, an output at which the PV cell 302 exits the continuous path of the multi-operation tool 300, i.e., the conveyor path 312. For example, after passing through the stations of the multi-operation tool 300, the PV cell 302 can exit onto a conveyor output 330 that carries the PV cell 302 to be processed further and/or assembled into a super cell 100.

Additional stations can be incorporated in multi-operation tool 300 to provide functionalities beyond laser scribing and adhesive printing. For example, the multi-operation tool 300 illustrated in FIG. 3 includes four stations positioned along the conveyor path 312 at 90 degree intervals relative to the axis 310. Additionally, an alignment station, a paper nest inspection station, or other processing stations, can be positioned along the conveyor path 312. Thus, the layout of multi-operation tool 300 described above is intended to be illustrative rather than limiting. For example, several alternative layouts of the multi-operation tool 300 are described below with respect to FIGS. 5-7. First, however, several individual operations associated with the multi-operation tool 300 shall be described.

Figure 4:
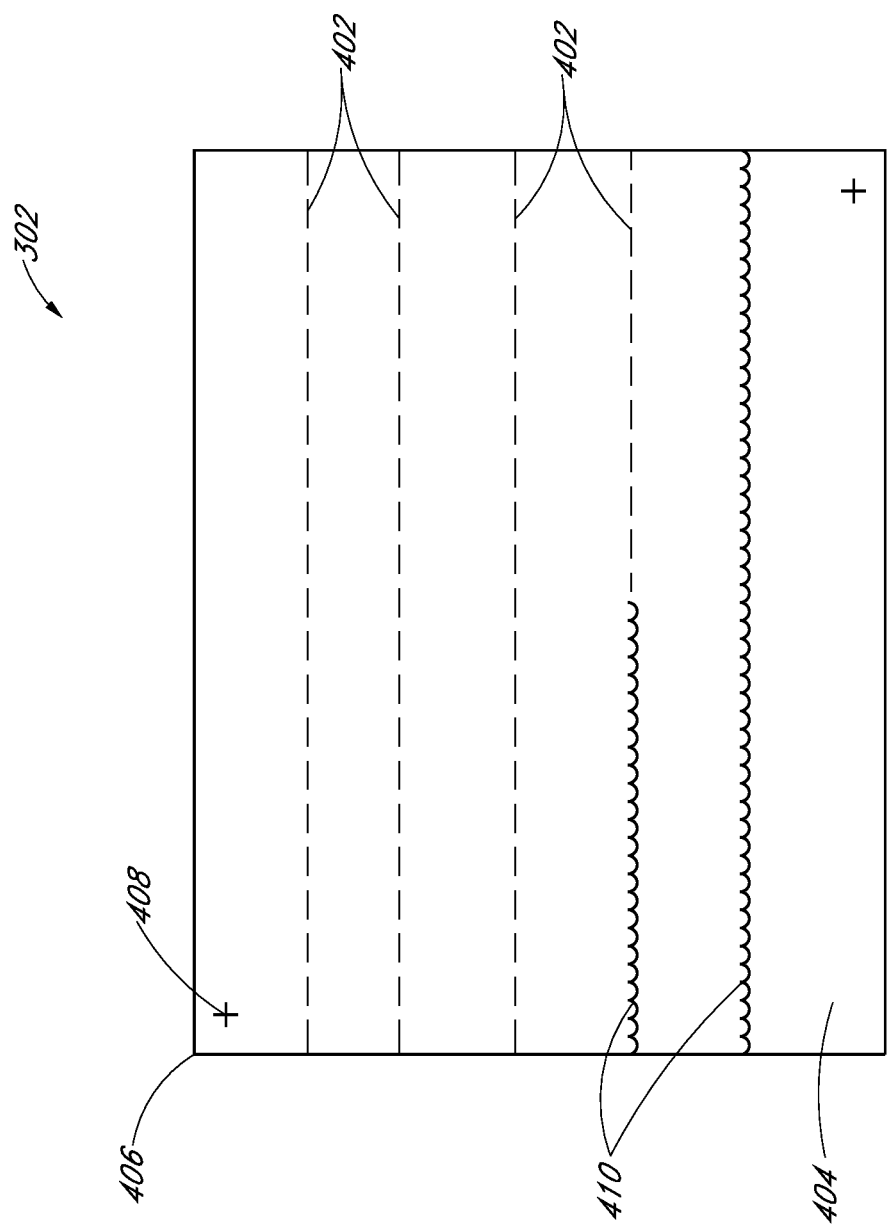
FIG. 4 illustrates a top view of a PV cell processed by a multi-operation tool.

Referring to FIG. 4, a top view of a PV cell processed by a multi-operation tool is illustrated. The PV cell 302 can have been processed by the laser scribing station 314 to form several scribe lines 402 on a surface 404 of the PV cell 302. The PV cell 302 can be a standard rectangular-shaped PV cell 302. For example, the PV cell 302 can include a rigid square substrate having sides measuring 125 millimeters or 156 millimeters. The laser scribing station 314 can be used to scribe lines 402 on the PV cell 302 to define the locations at which the PV cell 302 is to be cleaved to form narrow rectangular PV cell strips for assembly into a super cell 100. The laser head 316 of the laser scribing station 314 can direct a laser beam to remove material during scribing of the PV cell 302. For example, the laser beam can be an ablation laser beam. Thus, the laser scribing station 314 can remove a portion of the PV cell 302 material without cutting through the entire cell thickness. By way of example, the PV cell 302 can have a thickness between 125 to 250 microns, and the laser scribing station 314 can scribe the scribe lines 402 to a depth in a range of 60 to 100 microns.

Figure 11A:
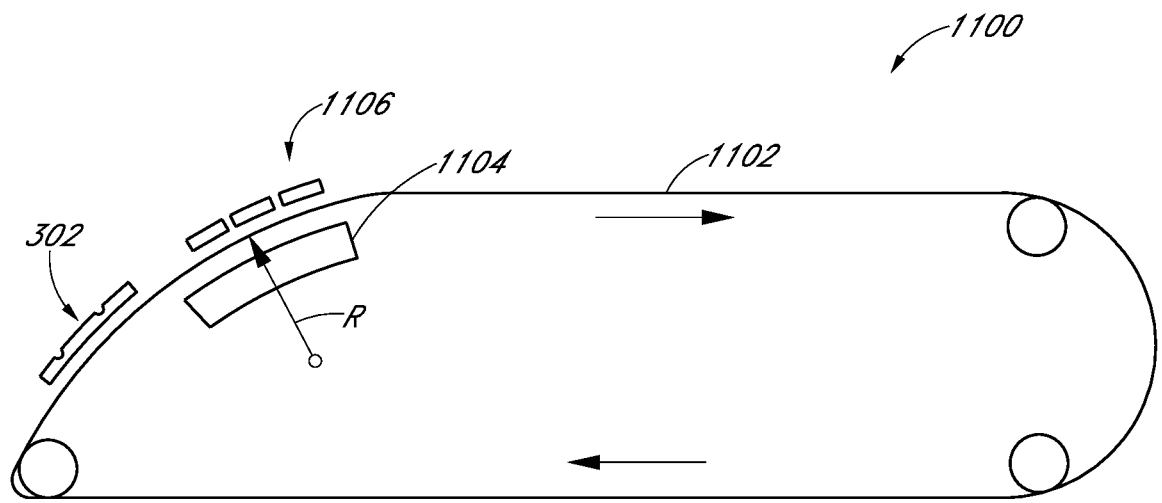
FIGS. 11A-11C illustrate schematic views of an apparatus that can be used to cleave scribed PV cells.
Figure 11B:
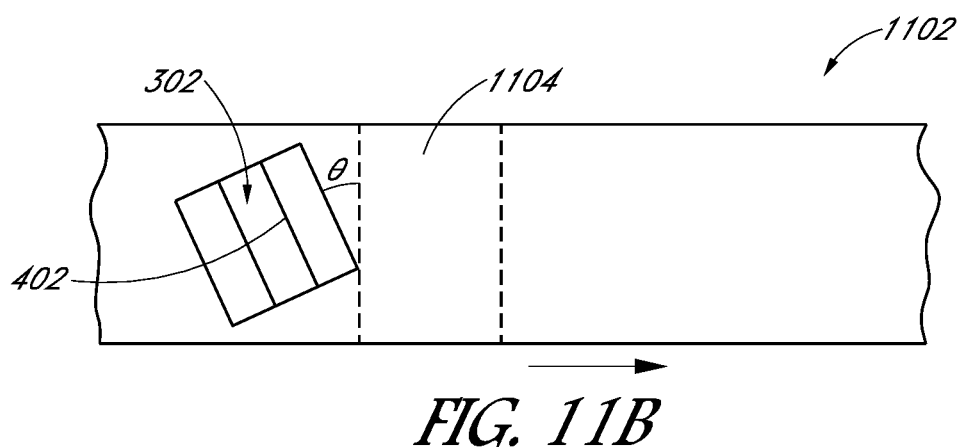
Figure 11C:
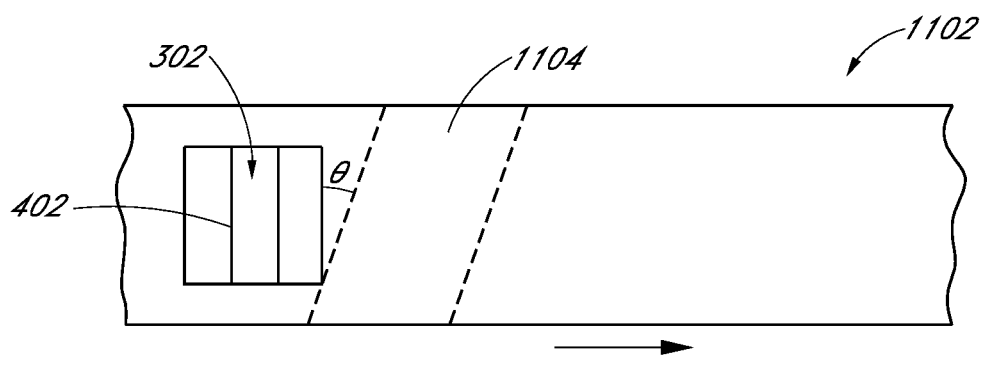

The laser head 316 of the laser printing station can include a galvanometer scanner, a beam splitter, or another mechanism to direct the laser beam across the surface 404 of the PV cell 302. Accordingly, the scribe lines 402 can be formed in any pattern on the surface. In an embodiment, the scribe lines 402 can extend across the surface parallel to each other and a direction of the scribe lines 402 can be tangential to the conveyor path 312. The tangential orientation of the scribe lines 402 can facilitate the cleaving process after the PV cell 302 exits the conveyor system (FIGS. 11A-11C).

Still referring to FIG. 4, the PV cell 302 can be processed by the adhesive printing station 320 to apply an adhesive 410 on the surface 404 of the PV cell 302. For example, a conductive adhesive bonding material can be applied to the PV cell 302 by the adhesive printing station 320 using an ink jet or screen printing technique. A screen printing technique can be a wet process that includes the use of a squeegee to apply the adhesive 410 on the surface along the scribe lines 402. For example, the adhesive 410 can be applied within 1 millimeter of the scribed edge, e.g., covering an 0.25 millimeter swath of the surface along the scribed edge. Thus, a direction of the laser scribe and the squeegee movement can be parallel. In other words, the direction of the laser scribe line 402 and the orientation of the squeegee blade can be orthogonal or perpendicular to each other. The parallel movement of the squeegee along the scribe line 402 can reduce the likelihood of breaking, or applying stresses that could break, the previously-scribed PV cell 302.

The mechanical layout of the multi-operation tool 300 can allow for repeatability and accuracy in the position of the PV cell 302 as it traverses the conveyor path 312. For example, in the case of the multi-operation tool 300 having a rotary motion of the cell platform 306 about the axis 310, it shall be noted that the loading location 305, the lasing location 318, and the printing location 324 are circumferentially aligned on the conveyor path 312 at a same radius 370 from the axis 310 (FIG. 3). Accordingly, each PV cell 302 processed by the multi-operation tool 300 can include one or more points of reference, e.g., a corner 406 of the PV cell 302 or a reference point 408 on the surface 404, such as a surface metallization feature, that follows the same path around the axis 310 as it is carried by the cell platform 306 of the conveyor system. As such, a relative distance between the reference point 408 and the conveyor path 312 can be known, and accordingly, a relative distance between the reference point 408 and the lasing location 318 or the printing location 324 can also be known by association. For example, if the reference point 408 is known to be located a radial distance of 50 millimeters radially outward from the conveyor path 312 relative to the axis 310, then the reference point 408 can also be known to be 50 millimeters radially outward from the lasing location 318 as it passes through the laser scribing station 314 and becomes radially aligned with the lasing location 318. The repeatability of such relative positioning can be further enabled using reference features such as pins on the cell platform 306 that the PV cell 302 can be placed against to register the reference point 408 in the same location each time a PV cell 302 is loaded. The conveyor system can also incorporate encoders to ensure repeatable and accurate movement of the cell platform 306. Accordingly, in an embodiment, multi-operation tool 300 can be used to process the PV cell 302 without using active alignment between the cell platform 306 and the laser head 316 or the printer head 322. As a practical matter, however, such active alignment can be useful to increase manufacturing yields.

Referring again to FIG. 3, multi-operation tool 300 can incorporate an active alignment system to align the PV cell 302 mounted on the cell platform 306 with the various processing locations in each of the stations along the conveyor path 312. The active alignment system can be incorporated within a station of its own, e.g., an alignment station 502. The active alignment system can be incorporated as a separate functionality within a different station, e.g., within the loading station 304, or the active alignment system can be located within multi-operation tool 300 outside of a separately defined station housing. For example, the active alignment system can include a vision system 350 positioned over the conveyor path 312 at the loading station 304, or along the conveyor path 312 between the loading station 304 and the laser scribing station 314.

In an embodiment, the vision system 350 determines a position of the reference point 408 on the PV cell 302 when the PV cell 302 is mounted on the cell platform 306. For example, when the cell platform 306 carrying the PV cell 302 passes under a camera of the vision system 350, image data can be collected and processed using image processing software of a computer system 352 to determine the location of the reference point 408, the corner 406, or another position indicator of the PV cell 302. The vision system 350 can be calibrated to determine a relative distance between the identified reference point 408 and another datum of the multi-operation tool 300. For example, the computer system 352 can calculate a relative distance between the reference point 408 and the conveyor path 312 along a line perpendicular to the conveyor path 312. Similarly, the computer system 352 can calculate a relative distance between the reference point 408 and the axis 310. In other words, the computer system 352 can calculate an absolute position of the reference point 408 within a frame of reference of the multi-operation tool 300, or the computer system 352 can calculate a relative position between the reference point 408 and a datum of the multi-operation tool 300.

The vision system 350 can also determine a position of features on the PV cell 302 with predetermined spatial relationships to the identified reference point 408. For example, each strip of the PV cell 302 can have a predetermined width defined by a distance between adjacent scribe lines 402, e.g., 26 millimeters. Thus, if an absolute position of the corner 406 of the PV cell 302 is determined within the frame of reference of the multi-operation tool 300, then a left side of a scribe line 402 can be determined to be 26 millimeters along an edge of the PV cell 302 (by way of example) from the corner 406. One skilled in the art will understand that the captured image data can be processed to determine other physical features of the PV cell 302, e.g., the edges intersecting at the corner 406 can be identified and used to calculate an angle of rotation of the PV cell 302 with respect to an axis passing through the PV cell 302. Thus, the examples above illustrate that the vision system 350 can determine a current position of the PV cell 302.

After determining a current position of the PV cell 302, an alignment of the PV cell 302 relative to other components of the multi-operation tool 300 can be determined. Absolute positions or relative positions of other tool components within the frame of reference of the multi-operation tool 300 can be determined using encoders, proximity sensors, etc. For example, a relative distance between the lasing location 318 or the printing location 324 and the conveyor path 312, along a line perpendicular to the conveyor path 312, can be determined. Such a relative distance can correspond directly to the determined relative position of the reference point 408 on the PV cell 302. For example, if the corner 406 of the PV cell 302 is determined to be 50 mm radially outward from the conveyor path 312, then the laser head 316 can be moved until the lasing location 318 is also 50 mm radially outward from the conveyor path 312. The laser beam can then be directed to the corner 406 (or a left edge of the PV cell 302) when the cell platform 306 passes through the laser scribing station 314 under the laser head 316. In an embodiment, a shutter can block the laser beam as needed. Accordingly, the laser head 316 or the printer head 322 can be moved within the frame of reference of the multi-operation tool 300 to align the lasing location 318 or the printing location 324 with the desired location on the PV cell 302, e.g., along the predetermined scribe line 402 locations. It will be understood that movement of the laser head 316 or the printing head can be accomplished using mechanisms such as galvanometer scanners, motors, robotics, etc. Such motion systems can be referred to as alignment actuators. Furthermore, control of the alignment actuators can be performed by the computer system 352. For example, the alignment actuators can be actuated based on the determined position of the reference point 408 on the PV cell 302 to align processing locations of the stations, e.g., the lasing location 318 or the printing location 324, with the predetermined processing locations on the PV cell 302, e.g., the scribe lines 402.

The cell platform 306 can be moved to align the processing locations of the stations with the predetermined processing locations on the PV cell 302. For example, after registering the PV cell 302 in the loading station 304, in an alignment station, and/or along the conveyor path 312, an alignment actuator 354 operably coupled to the cell platform 306 can be actuated based on the determined position of the reference point 408 on the PV cell 302. The alignment actuator 354 can be an x-y stage to move the PV cell 302 on the cell platform 306 in any direction along a plane of the conveyor system, e.g., on a platform table. The alignment actuators 354 can, however, be rotary actuators. For example, the cell platform 306 can be rotated about an axis parallel to the axis 310 of multi-operation tool 300 to bring the PV cell 302 into alignment with a predetermined angle of rotation of a frame of reference of the multi-operation tool 300 or the stations. Thus, the cell platform 306 can be moved into the predetermined alignment for accurate processing.

Movement of the cell platform 306 or the station heads can occur as the cell platform 306 is being moved along the conveyor path 312. That is, the vision system 350 can identify the position of the PV cell 302 and the PV cell 302 can be moved into alignment with an upcoming station while the conveyor system continues to rotate the cell platform 306 about the axis. Accordingly, the adjustments of the station heads or the cell platform 306 can be made in the most efficient manner, e.g., according to the speed and inertia of each of the system components. Furthermore, the continuous movement of the cell platform 306 between the alignment station (at the vision system camera) and the other stations (the laser scribing station 314 or the adhesive printing station 320) allows for the PV cell 302 to be aligned once and then processed two or more times without being realigned.

Figure 5:
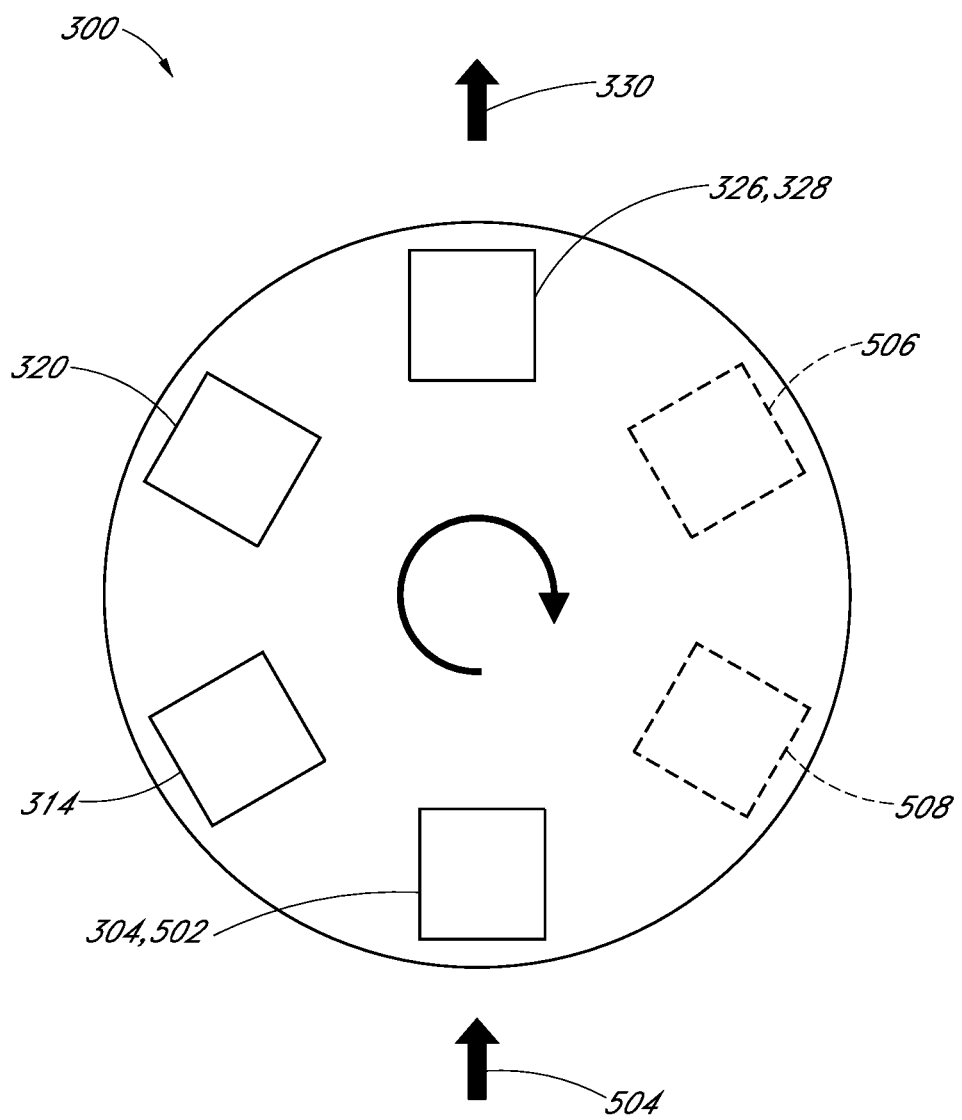
FIG. 5 illustrates a schematic view of a multi-operation tool having a rotary conveyor system.

Referring to FIG. 5, a schematic view of a multi-operation tool having a rotary conveyor system is illustrated. Additional stations can be incorporated in the multi-operation tool 300. For example, the multi-operation tool 300 can include the loading station 304, an alignment station 502, the laser scribing station 314, the adhesive printing station 320, the inspection station 326, and the unloading station 328, as described above. In an embodiment, the active stations, i.e., the stations of the multi-operation tool 300 that act directly on the PV cell 302, can be arranged around 180 degrees of the multi-operation tool 300. That is, whereas the conveyor system rotated the cell platform 306 around the axis 310 from the loading station 304 to the unloading station 328 over a 270 degree arc in the embodiment illustrated in FIG. 3, the cell platform 306 can traverse a 180 degree arc between the loading station 304 and the unloading stations 328 as illustrated in FIG. 5. Thus, the cell platform 306 can be rotated 90 degrees between each station (FIG. 3), 60 degrees between each station (FIG. 5), or another angle depending on the distribution of the stations around the conveyor path 312.

In addition to having active stations, multi-operation tool 300 can incorporate one or more inactive stations, i.e., stations that do not act directly on the PV cell 302. For example, a chuck cleaning station 506 can be used for cleaning the cell platform 306 and/or the chuck. Similarly, a chuck inspection station 508 can be used for inspecting the cell platform 306 and/or the chuck.

The multi-operation tool 300 can be an in-line tool. That is, the PV cell 302 can be an input 504 to the multi-operation tool 300 on a first side of the conveyor path 312 and the PV cell 302 can exit the multi-operation tool 300 on a second, opposite side of the conveyor path 312. Thus, conveyors such as conveyor belts can be in line along a same axis passing through both the input conveyor belts and the output conveyor belts.

Figure 6:
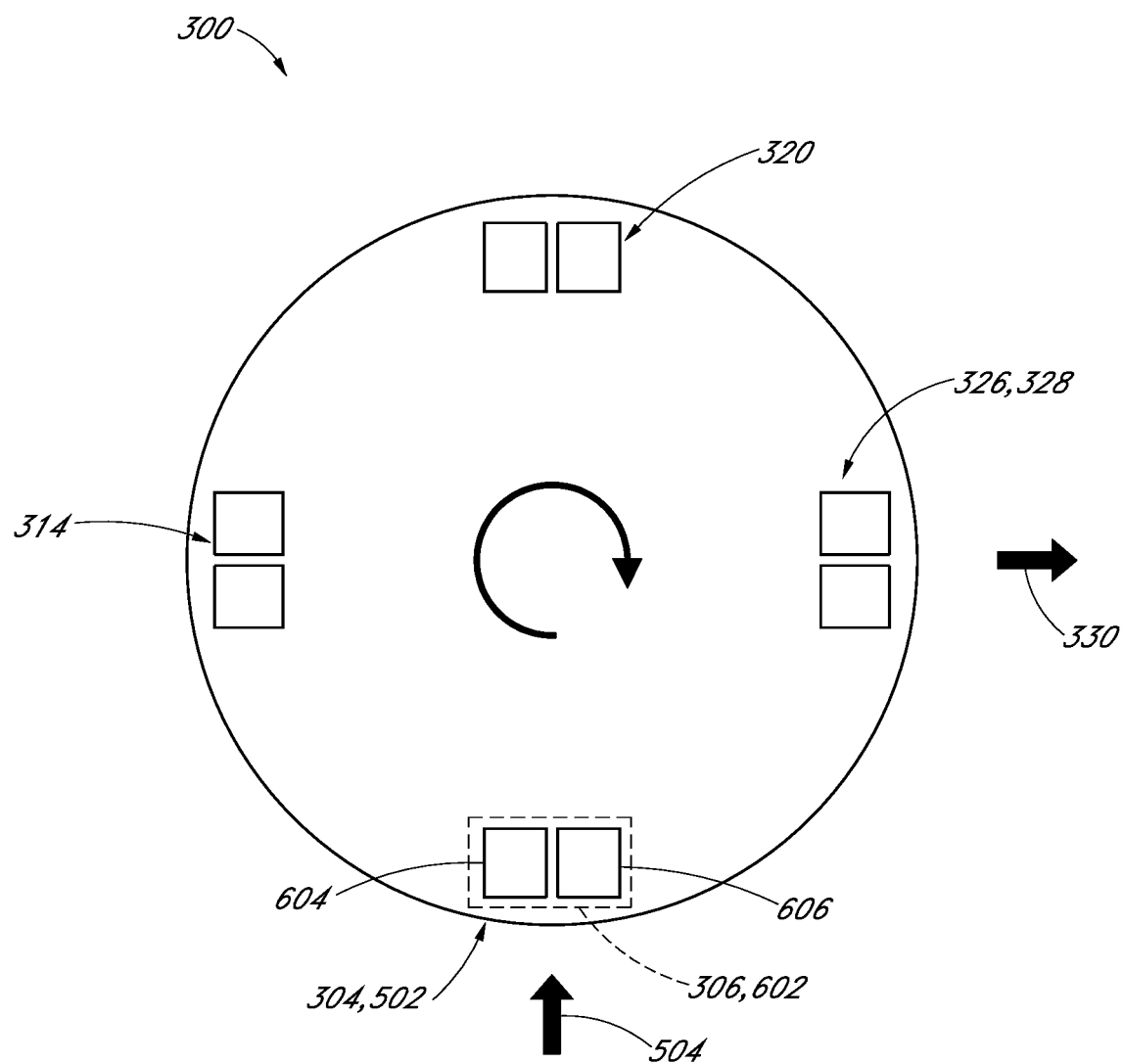
FIG. 6 illustrates a schematic view of a multi-operation tool having a rotary conveyor system.

Referring to FIG. 6, a schematic view of a multi-operation tool having a rotary conveyor system is illustrated. The multi-operation tool 300 can be capable of processing multiple PV cells 302 at each station at the same time. For example, the cell platform 306 can include a multi-chuck 602. The multi-chuck 602 can be a sub-system having two or more chucks positioned relative to each other such that a first PV cell 302 can be mounted on a first chuck 604 and a second PV cell 302 can be mounted on a second chuck 606. It will be understood that the multi-operation tool 300 can be configured to secure any number of PV cells 302 (e.g., one, two, three, or more) using any number of chucks or multi-chucks 602. The multi-chuck 602 can be moved along the conveyor path 312 and the PV cells 302 can be processed at each station simultaneously or sequentially.

Figure 7:
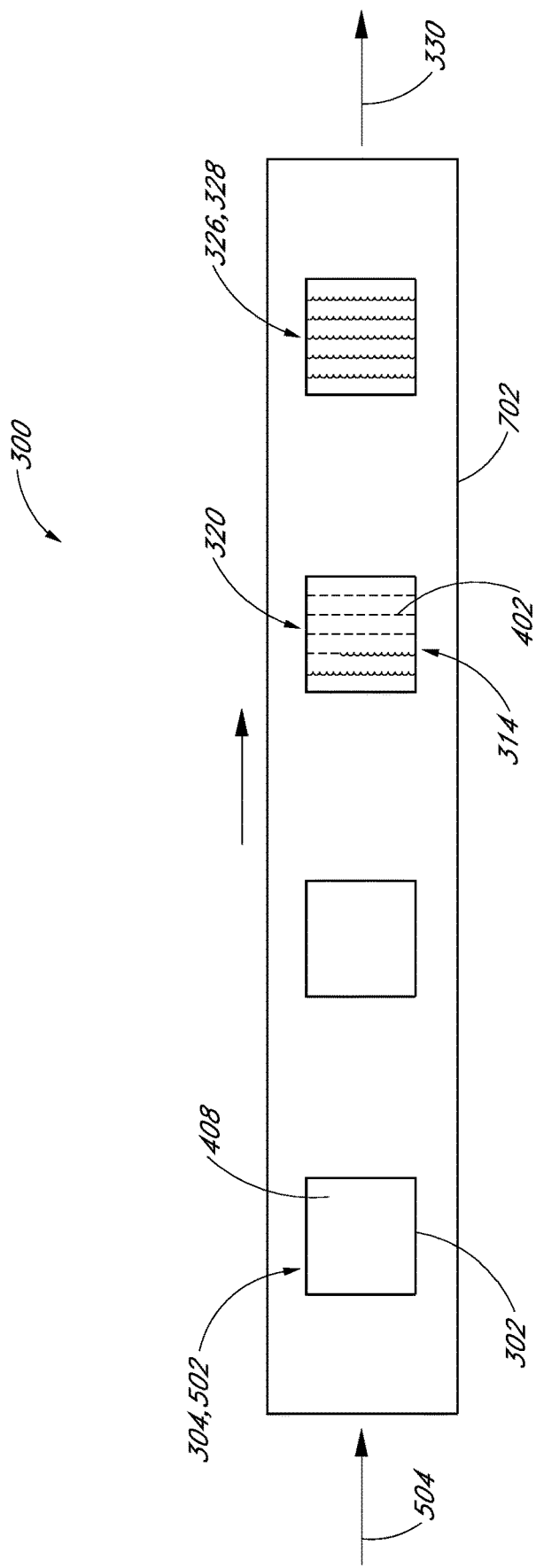
FIG. 7 illustrates a schematic view of a multi-operation tool having a linear conveyor system.

Referring to FIG. 7, a schematic view of a multi-operation tool having a linear conveyor system is illustrated. The layouts of multi-operation tool 300 having a rotary conveyor system are described above by way of example. The conveyor system, however, can incorporate a different continuous layout, such as a linear conveyor system 702 to move PV cell 302 along a linear path. A PV cell 302 can be input 504 to a linear conveyor system 702 at a loading station 304, which can also be the alignment station 502. The reference point 408 on the PV cell 302 can be determined prior to being conveyed by the conveyor system 702 to the subsequent laser scribing station 314 or adhesive printing station 320. The linear conveyor system 702 can incorporate, for example, a linear stage and/or a conveyor belt system such that the PV cell 302 follows a continuous linear conveyor path 312 from the conveyor input 504 to the conveyor output 330. Thus, the principle of aligning the PV cell 302 once and then performing several processes to the PV cell 302 in several subsequent stations of multi-operation tool 300 can apply to both the rotary and linear conveyor systems. For example, after determining the position of the reference point 408 on the PV cell 302, the PV cell 302 can have one or more scribe lines 402 formed in a top surface at the laser scribing station 314. Scribe lines 402 have been formed in the PV cell 302 illustrated in FIG. 7. Furthermore, after determining the position of the reference point 408, the PV cell 302 can have an electrically conductive adhesive 410 printed along the scribe lines 402 formed in the top surface at the adhesive printing station 320. The PV cell 302 can then progress along the conveyor path to the unloading station 328 and/or inspection station 326 for final handling before exiting to the conveyor output 330.

As shown in each of the embodiments above, several PV cells 302 can be loaded in the multi-operation tool 300 at once, and thus, a PV cell 302 can be aligned at the alignment station 502 at the same time that another PV cell 302 is being processed by the laser scribing station 314 and/or the adhesive printing station 320. It will be noted that it is unnecessary to handle the PV cell 302 manually to move the PV cell 302 from one station to another, and thus, there can be less manufacturing fallout from breakage of PV cells 302. Correspondingly, scribe lines 402 can be formed more deeply in the surface of the PV cell 302 since the PV cell 302 need not be as robust to withstand operator handling.

In an embodiment, each of the stations of the multi-operation tool 300 include environments specific to their own process requirements. For example, the laser scribing station 314 can include suction and/or venting to remove particulate generated during the laser scribing process. Similarly, the adhesive printing station 320 can be temperature-controlled to maintain consistency of the adhesive viscosity during the printing process. Accordingly, the process stations can be isolated from each other, e.g., to prevent cross-contamination.

Figure 8:
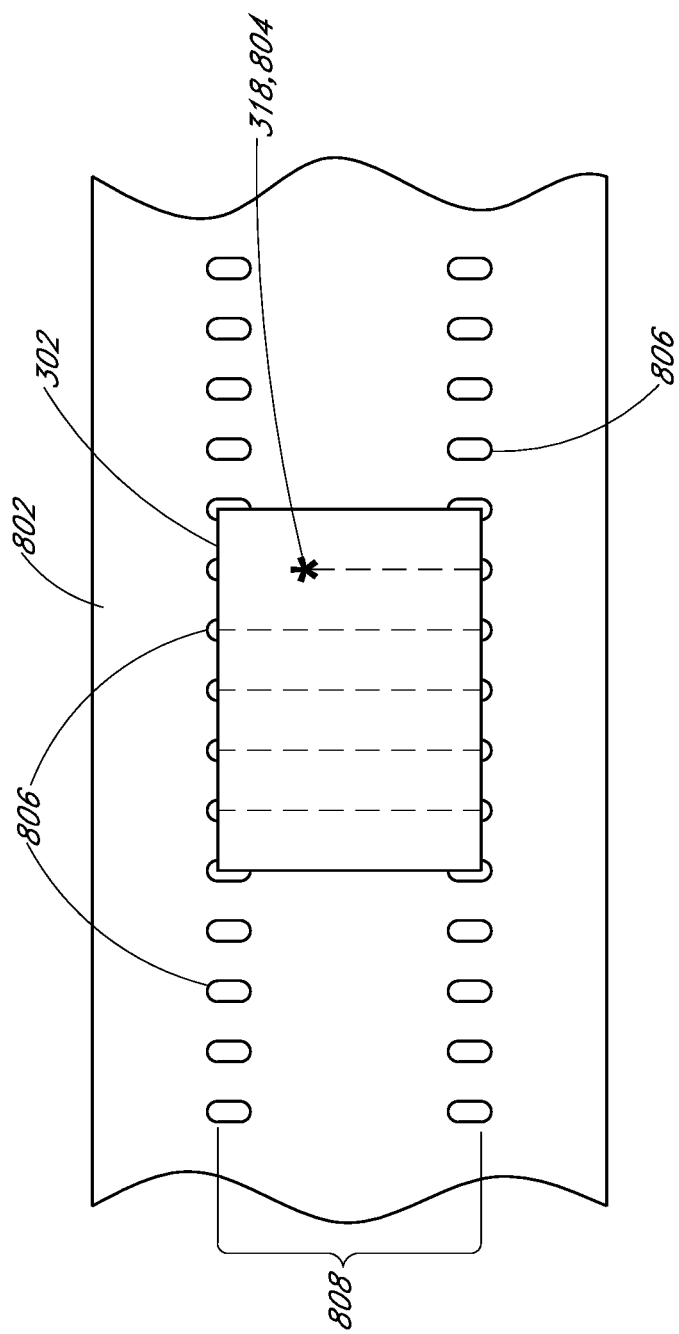
FIG. 8 illustrates a top view of a PV cell on a protective substrate of a multi-operation tool.

Referring to FIG. 8, a top view of a PV cell on a protective substrate of a multi-operation tool is illustrated. Additional features of the multi-operation tool 300 can further facilitate function of the equipment and process. For example, the adhesive printing process can be a wet process in which the adhesive 410 or other foreign materials can inadvertently be spread onto the conveyor system. This can occur, for example, when the squeegee of the adhesive printing station 320 spreads the adhesive 410 along the scribe lines 402 and the adhesive 410 is forced off of the PV cell 302 onto the underlying cell platform 306. This inadvertent spreading of the adhesive 410 can reduce manufacturing yields. Thus, measures to isolate the conveyor system 702 from the PV cell 302 can be desirable.

A protective substrate 802 such as paper can be placed between the conveyor system 702 and the PV cell 302 to reduce the likelihood that the adhesive 410 will migrate from the squeegee to the conveyor system 702. More particularly, the protective substrate 802 can be placed under the PV cell 302 to capture any adhesive 410 that spreads off of the PV cell 302. The protective substrate 802 can adequately capture the adhesive 410. However, in the context of the multi-operation tool 300 having a single alignment operation followed by the lasing operation and the printing operation, there is a risk that the laser beam can burn the protective substrate 802 during the lasing operation. More particularly, as the laser beam spot at the lasing location 318 progresses outward from the edges of the PV cell 302 during line scribing, the laser can contact and burn the protective substrate 802 at the ends of every scribe.

In an embodiment, the protective substrate 802 includes a belt 1102 of paper having several slot spacings 808 positioned and aligned with the ends of the scribe lines 402 on the PV cell 302. As the laser beam scans across the PV cell 302 surface, the laser spot 804 can pass through the slot spacings 808 and cannot contact the protective substrate 802. For example, the slot spacings 808 can be perforated in the paper belt, and there can be a corresponding hole in the cell platform 306 and/or the conveyor system 702 to receive the laser spot 804. That is, the hole can be deep enough for the laser to defocus as it passes through the slot spacing 808 toward the conveyor system 702 or chuck. A slot spacing 808 spacing in a width direction can have a dimension corresponding to the width of the PV cell 302. For example, the slot spacing 808 spacing can be 156 millimeters corresponding to a square PV cell 302 having sides measuring 156 millimeters. The distance between slot spacings 808 in the direction of travel along the conveyor path 312 can correspond to the separation between scribe lines 402. For example, the slot spacings 808 can be separated in the conveyor path 312 direction by a distance of 26 millimeters corresponding to a separation between scribe lines 402 of 26 millimeters. In an embodiment, the holes can have a width and/or length dimension of less than half of the separation distance between scribe lines 402, e.g., less than 10 millimeters.

The protective substrate 802 can include a paper belt having ends rolled onto respective conveyor belt pulleys. For example, a first end of the paper belt can be wrapped on a first pulley and a second end of the paper belt can be wrapped on a second pulley. Thus, rotation of the first pulley can cause the paper belt to unwind from the second pulley, and for the paper wrapped around the second pulley to be transferred to the first pulley. Accordingly, the protective substrate 802 can travel continuously underneath the cell platform 306 as it propagates along the conveyor path 312. The paper belt described herein can be made of virgin and/or recycled fibers, and can be treated with any of a number of coatings (e.g., an adhesive coating, a lubricant, a fire-retardant coating, hydrophobic coatings, etc.). The paper can be marked (e.g., with numbers, letters, symbols, etc.) to indicate useful information such as the amount of paper remaining in the roll, or an indication to that the roll is nearly exhausted. It will be understood that other protective substrates 802 such as plastic, cloth, canvas, foil, etc. can be used instead of paper or in addition to paper (e.g., plastic, cloth, canvas, metal, etc. integrated in the paper). Additives to the paper such as plastic, cloth, canvas, metal, etc., can provide structural support, for example.

Figure 9:
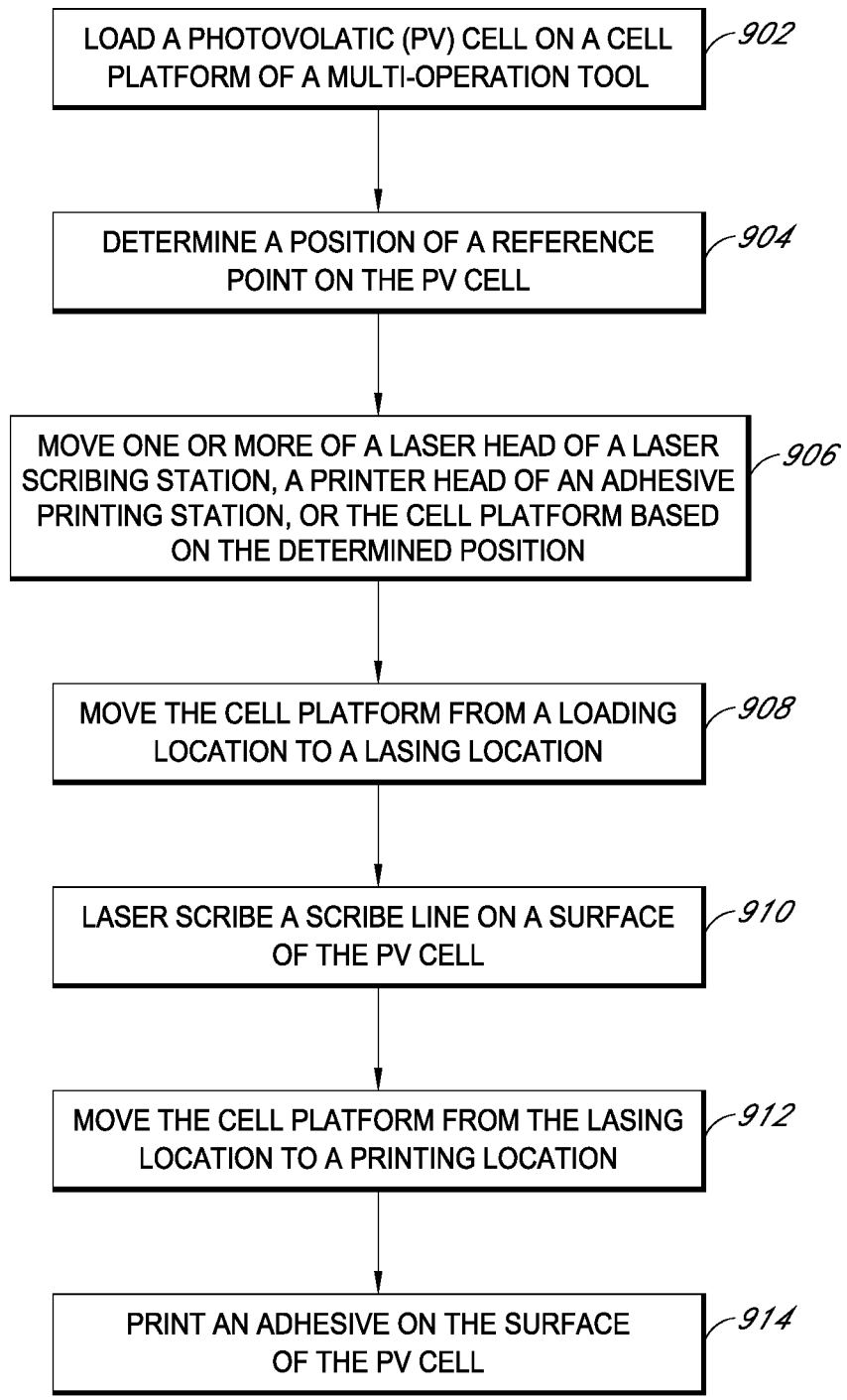
FIG. 9 illustrates flowchart of a method of processing a PV cell by a multi-operation tool having a laser scribing station and an adhesive printing station.
Figure 10:
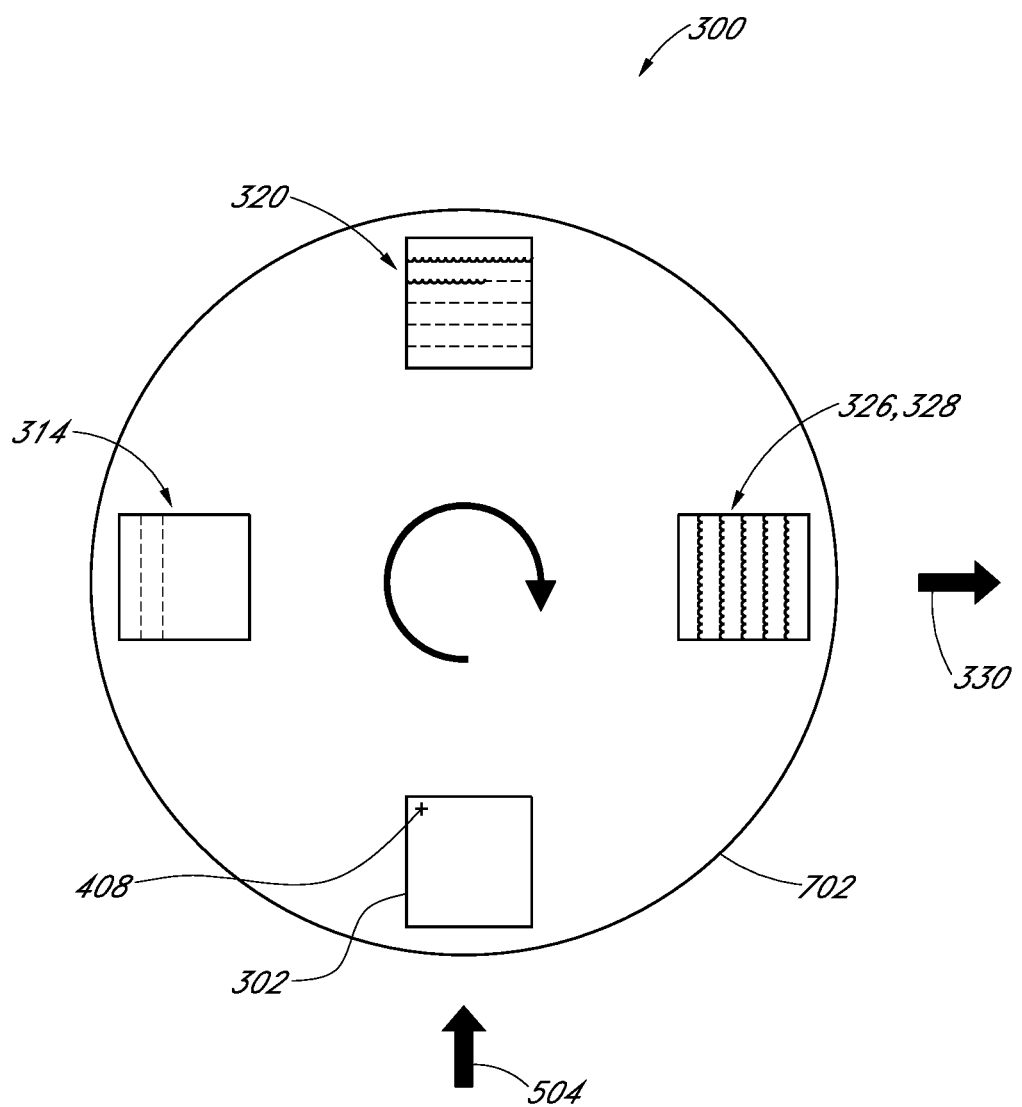
FIG. 10 illustrates a schematic view of a multi-operation tool performing a continuous multi-operation process.

Referring to FIG. 9, a method of processing a PV cell by a multi-operation tool having a laser scribing station and an adhesive printing station is illustrated. The method will be described with respect to the multi-operation tool 300 layout illustrated in FIG. 10, which includes a schematic view of the multi-operation tool 300 performing a continuous multi-operation process.

At operation 902, a PV cell 302 can be loaded on the conveyor system 702 of the multi-operation tool 300. For example, the PV cell 302 can be loaded on the cell platform 306 of the conveyor system 702. The conveyor system 702 can include one or more actuators operably connected to the cell platform 306 to move the cell platform 306 along the conveyor path 312 continuously from the loading location 305 back to the same loading location 305. For example, the actuator can be a rotary actuator 308 operably coupled to the cell platform 306 to rotate the cell platform 306 about the axis 310. Accordingly, the loading location 305, the lasing location 318, and the printing location 324 can be circumferentially aligned on the conveyor path 312 at a same radius 370 from the axis 310. Thus, the cell platform 306 can pass through the loading location 305, the lasing location 318, and the printing location 324 as it travels continuously along the conveyor path 312 from the loading location 305 back to the same loading location 305.

At operation 904, a position of the reference point 408 on the surface of the PV cell 302 can be determined, e.g., using a camera of the vision system 350.

At operation 906, alignment of the PV cell 302 can be performed. For example, one or more of the laser head 316 of the laser scribing station 314, the printer head 322 of the adhesive printing station 320, or the cell platform 306 holding the PV cell 302 can be moved based on the determined position of the reference point 408. Movement of the components can be performed to bring a predetermined position on the PV cell 302, e.g., a starting location of a scribe line 402, into vertical alignment with the laser head 316 or the printer head 322.

At operation 908, the cell platform 306 can move along the conveyor path 312 from the loading location 305 of the loading station 304 to the lasing location 318 of the laser scribing station 314. The lasing location 318 can be under the laser head 316 of the laser scribing station 314. At operation 910, the laser beam of the laser scribing station 314 can scribe one or more scribe lines 402 on the surface of the PV cell 302.

At operation 912, the cell platform 306 can be moved along the conveyor path 312 from the lasing location 318 of the laser scribing station 314 to the printing location 324 of the adhesive printing station 320. The printing location 324 can be under the printer head 322 of the adhesive printing station 320. At operation 914, an adhesive 410, e.g., an electrically conductive adhesive 410, can be printed on the surface of the PV cell 302. Thus, the PV cell 302 can be aligned once, and then can be laser scribed and printed with an adhesive 410 without being realigned between the lasing and printing operations.

After lasing and printing on the surface of the PV cell 302, the cell platform 306 can be moved along the conveyor path 312 to the unloading station 328 and/or inspection station 326 where it can be inspected by a camera of a vision system 350 and/or unloaded onto the conveyor output 330 to exit the multi-operation tool 300. Additional processes can be performed on the PV cell 302 after the PV cell 302 has been laser scribed and printed with an adhesive 410. These processes can be incorporated in the multi-operation tool 300 as additional operations in the continuous process flow, or can be performed after the PV cell 302 exits the multi-operation tool 300, e.g., when the PV cell 302 is on the conveyor output 330.

Referring to FIGS. 11A-11C, schematic views of an apparatus that can be used to cleave scribed PV cells is illustrated. FIG. 11A schematically illustrates a side view of an example apparatus that can be used to cleave scribed PV cells 302 to which conductive adhesive 410 bonding material has been applied. Scribing and application of conductive adhesive 410 bonding material can have occurred in either order using the multi-operation tool 300. A scribed conventionally-sized PV cell 302 to which conductive adhesive bonding material has been applied can be discharged from the unloading station 326 to the cleaving system 1100. That is, a perforated belt 1102 of the cleaving system 1100 can receive the PV cell 302 from the unloading station 326 at the conveyor output 330. The PV cell 302 can be carried by the perforated moving belt 1102 over a curved portion of a vacuum manifold 1104 of the cleaving system 1100. As PV cell 302 passes over the curved portion of the vacuum manifold 1104, a vacuum applied through the perforations in the belt 1102 pulls the bottom surface of PV cell 302 against the vacuum manifold 1104 and thereby flexes the PV cell 302. The radius of curvature R of the curved portion of the vacuum manifold 1104 can be selected so that flexing PV cell 302 in this manner cleaves the PV cell 302 along the scribe lines 402 to form PV subcells 1106. Advantageously, the PV cell 302 can be cleaved by this method without contacting the top surface of PV cell 302 to which the conductive adhesive 410 bonding material has been applied.

If it is preferred for cleaving to begin at one end of a scribe line 402 (i.e., at one edge of PV cell 302), this can be accomplished with the cleaving system 1100 of FIG. 11A by arranging for the scribe lines 402 to be oriented at an angle θ to the vacuum manifold 1104 so that, for each scribe line 402, one end reaches the curved portion of the vacuum manifold 1104 before the other end. As shown in FIG. 11B, for example, the PV cells 302 can be oriented with their scribe lines 402 at an angle to the direction of travel of the belt 1102 and the manifold oriented perpendicularly to the direction of travel of the belt 1102. As another example, FIG. 11C shows the cells oriented with their scribe lines 402 perpendicular to the direction of travel of the belt 1102, and the manifold oriented at an angle.

Any other suitable apparatus can also be used to cleave scribed PV cells 302 to which conductive adhesive bonding material has been applied to form strip PV cells 302 with pre-applied conductive adhesive bonding material. Cleaving system 1100 can, for example, use rollers to apply pressure to the top surface of the PV cell 302 to which the conductive adhesive bonding material has been applied. In such cases it is preferable that the rollers touch the top surface of the PV cell 302 only in regions to which conductive adhesive bonding material has not been applied. After cleaving the scribed PV cell 302 into strips, the strips can be assembled into super cells 100.

Referring to FIGS. 12A-12D, example arrangements by which super cells can be cured with heat and pressure is illustrated. In FIG. 12A, heat and localized pressure 1202 are applied to cure or partially cure conductive adhesive 410 to bond one joint 1204 (overlapping region) at a time. The super cell 100 can be supported by a surface 1206 and pressure 1202 can be mechanically applied to the joint 1204 from above with a bar, pin, or other mechanical contact. Heat can be applied to the joint 1204 with hot air (or other hot gas), with an infrared lamp, or by heating the mechanical contact that applies localized pressure 1202 to the joint 1204.

In FIG. 12B, the arrangement of FIG. 12A is extended to a batch process that simultaneously applies heat and localized pressure 1202 to multiple joints 1204 in a super cell 100.

In FIG. 12C, an uncured super cell 100 is sandwiched between release liners 1212 and reusable thermoplastic sheets 1218 and positioned on a carrier plate 1210 supported by a surface 1206. The thermoplastic material of the sheets 1218 is selected to melt at the temperature at which the super cells 100 are cured. Release liners 1212 can be formed from fiberglass and polytetrafluoroethylene (PTFE), for example, and do not adhere to the super cell 100 after the curing process. Preferably, release liners 1212 are formed from materials that have a coefficient of thermal expansion (CTE) matching or substantially matching that of the solar cells 102 (e.g., the CTE of silicon). This is because if the CTE of the release liners 1212 differs too much from that of the solar cells 102, then the solar cells 102 and the release liners 1212 can lengthen by different amounts during the curing process, which would tend to pull the super cell 100 apart lengthwise at the joints 1204. A vacuum bladder 1214 overlies this arrangement. The uncured super cell 100 is heated from below through the surface 1206 and the carrier plate 1210, for example, and a vacuum 1216 is pulled between the bladder and the support surface 1206. As a result the bladder applies hydrostatic pressure 1202 to the super cell 100 through the melted thermoplastic sheets 1218.

In FIG. 12D, an uncured super cell 100 is carried by a perforated moving belt 1102 through an oven 1220 that heats the super cell 100. A vacuum 1216 applied through perforations in the belt 1102 pulls the solar cells 102 toward the belt 1102, thereby applying pressure to the joints 1204 between them. The conductive adhesive bonding material in those joints 1204 cures as the super cell 100 passes through the oven 1220. Preferably, the perforated belt 1102 is formed from materials that have a CTE matching or substantially matching that of the solar cells 102 (e.g., the CTE of silicon). This is because if the CTE of the belt 1102 differs too much from that of the solar cells 102, then the solar cells 102 and the belt 1102 will lengthen by different amounts in the oven 1220, which will tend to pull the super cell 100 apart lengthwise at the joints 1204.

Figure 13:
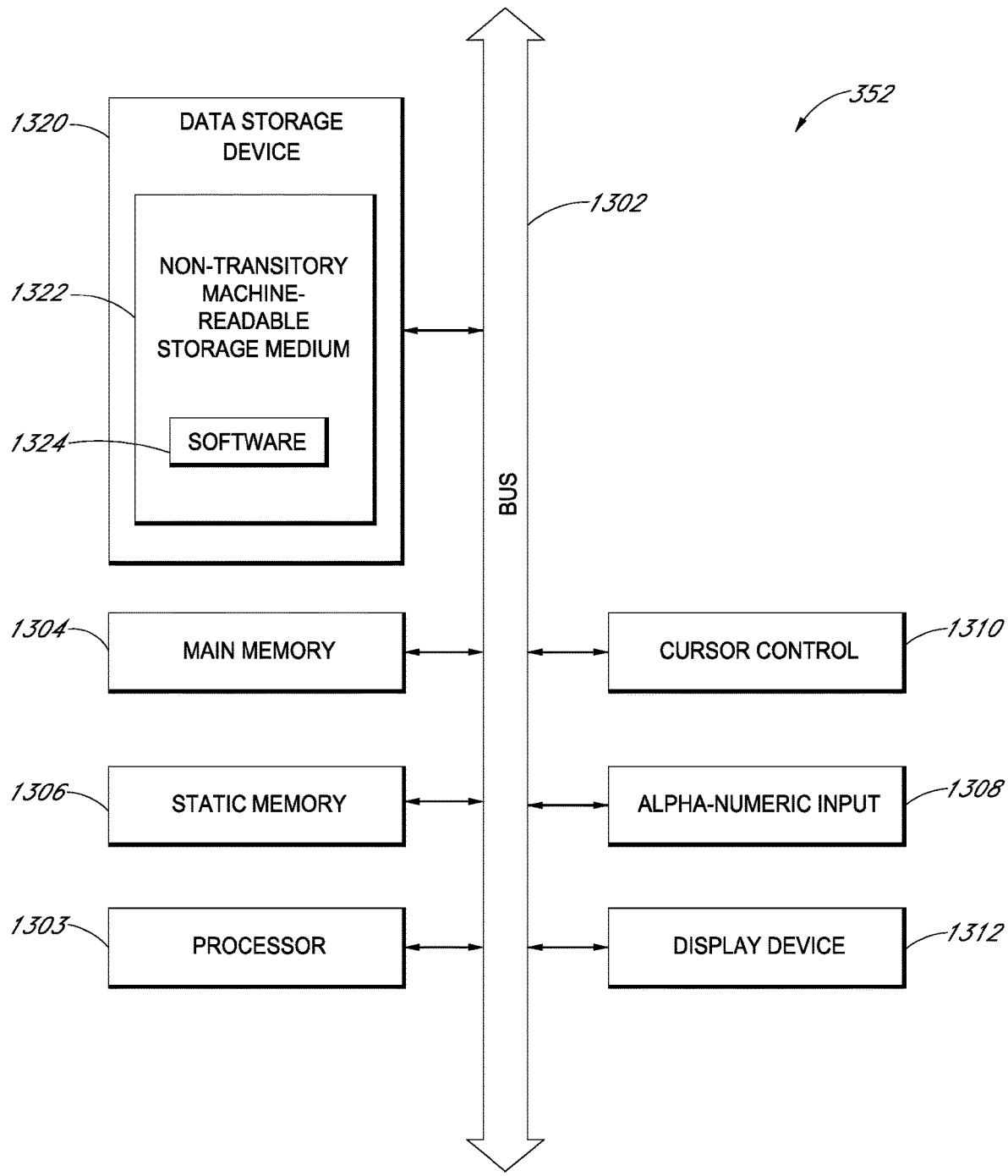
FIG. 13 illustrates a schematic view of a computer system.

Referring to FIG. 13, a schematic view of a computer system is illustrated. As described above, by way of example, the computer system 352 can: capture and analyze image data from a camera of the vision system 350 of the alignment station 502; perform calculations to determine relative positions between tool components; control actuators of the conveyor system and the stations along the conveyor path 312; or capture and analyze image data from a camera of the imaging system of the inspection station 326. The computer system 352 is exemplary, and embodiments of the invention can operate on, or be controlled by, a number of different computer systems 352 including general purpose networked computer systems 352, embedded computer systems 352, routers, switches, server devices, client devices, various intermediate devices/nodes, stand-alone computer systems 352, and the like. In an embodiment, computer system 352 includes an address/data bus 1302 for communicating information. For example, the computer system 352 can include a main logic board having a processor 1303, e.g., a central processing unit, coupled to the bus for processing information and instructions. The processor 1303 can execute instructions stored on a non-transitory computer-readable medium to cause the multi-operation tool 300 to perform the operations described above. The main logic board of the computer system 352 can also include data storage features such as a computer usable volatile memory 1304, e.g., dynamic random access memory (DRAM), coupled to the bus for storing information and instructions for the central processing unit. Computer usable non-volatile memory 1306, e.g., read only memory (ROM), can also be coupled to the bus and/or mounted on the main logic board for storing static information and instructions for the central processor.

Computer system 352 can include a data storage device 1320 (e.g., a magnetic or optical disk and disk drive) coupled to bus 1302 for storing information and instructions. Data storage device 1320 may include a non-transitory machine-readable storage medium 1322 storing one or more sets of instructions (e.g., software 1324). Software 1324 may include software applications, for example. Software 1324 may also reside, completely or at least partially, within main memory 1304, static memory 1306, and/or within processor(s) 1303 during execution thereof by processing system. More particularly, main memory 1304, static memory 1306, and processor(s) 1303 may also constitute non-transitory machine-readable storage media.

In addition to processing and memory hardware, the computer system 352 can include various input and output devices. For example, the computer system 352 can include an alphanumeric input device 1308 and/or cursor control device 1310 coupled to the bus for communicating user input information and command selections to the central processing unit. Likewise, the computer system 352 can include a display device 1312 coupled to the bus for displaying information to a user. Furthermore, the computer system 352 can include, or be coupled to, the vision system 350 of the multi-operation tool 300 to receive position data, e.g., image data indicating a position of a reference point 408 on a PV cell 302.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
    loading a photovoltaic (PV) cell on a cell platform of a conveyor system of a multi-operation tool, wherein the conveyor system includes an actuator operably coupled to the cell platform to move the cell platform along a conveyor path from a loading location to an unloading location;
    moving the cell platform along the conveyor path from the loading location to a lasing location, wherein the lasing location is under a laser head of a laser scribing station of the multi-operation tool;
    laser scribing, by the laser head, a scribe line on a first surface of the PV cell;
    moving the cell platform along the conveyor path from the lasing location to a printing location, wherein the printing location is under a printer head of an adhesive printing station of the multi-operation tool; and
    printing, by the printer head, an adhesive on the first surface of the PV cell, wherein the actuator is a rotary actuator operably coupled to the cell platform to rotate the cell platform about an axis, and wherein the loading location, the lasing location, and the printing location are circumferentially aligned on the conveyor path at a same radius from the axis.

2. The method of claim 1 further comprising:
    determining a position of a reference point on the PV cell; and
    moving one or more of the laser head, the printer head, or the cell platform based on the determined position.

3. The method of claim 2, wherein the one or more of the laser head, the printer head, or the cell platform are moved to maintain the reference point at a predetermined radial distance from one or more of the lasing location or the printing location.

4. The method of claim 1 further comprising laser scribing a second scribe line on the surface of the PV cell, wherein the scribe lines are scribed across the surface parallel to each other.

5. The method of claim 4, wherein the scribe lines are scribed across the surface tangential to the conveyor path.

6. The method of claim 5 further comprising cleaving the PV cell along the scribe lines to form PV subcells.

7. The method of claim 6 further comprising bonding, by the adhesive, the cleaved PV subcells to form a super cell.

8. The method of claim 7, wherein the adhesive is an electrically conductive adhesive.

9. The method of claim 1, wherein the cell platform is configured to support a second surface of the PV cell along the conveyor path such that the first surf ace of the PV cell is moved through the lasing location and the printing location, the second surface being opposite from the first surface of the PV cell.

10. The method of claim 1, further comprising:
    moving the scribed PV cell with a printed adhesive on the first surface of the PV cell from the unloading location to a cleaving system.

11. The method of claim 1, wherein the actuator is a rotary actuator operably coupled to the cell platform to rotate the cell platform about an axis, and wherein the loading location, the lasing location, and the printing location are circumferentially aligned on the conveyor path at a same radius from the axis.

12. The method of claim 1, wherein the conveyor path is a linear path extending from the loading location to the unloading location.

13. A method, comprising:
    supporting a bottom surface of a photovoltaic (PV) cell on a cell platform of a conveyor system, wherein the conveyor system includes an actuator operably coupled to the cell platform to move the cell platform along a conveyor path from a loading location to an unloading location;
    moving the cell platform along the conveyor path from the loading location to a lasing location of a laser scribing station;
    laser scribing, at the lasing location, a scribe line on a top surface of the PV cell;
    moving the cell platform along the conveyor path from the lasing location to a printing location of an adhesive printing station; and
    printing, at the printing location, an adhesive on the top surface of the PV cell, wherein the actuator is a rotary actuator operably coupled to the cell platform to rotate the cell platform about an axis, and wherein the loading location, the lasing location, and the printing location are circumferentially aligned on the conveyor path at a same radius from the axis;
    moving the cell platform along the conveyor path from the printing location to the unloading location.

14. The method of claim 13, further comprising determining a position of a reference point on the PV cell mounted on the cell platform.

15. The method of claim 14, wherein determining the position of the reference point on the PV cell is performed by a vision system positioned along the conveyor path between the loading location and the lasing location.

16. The method of claim 13, wherein the PV cell comprises a metallization pattern.

17. The method of claim 13, further comprising moving the scribed PV cell with a printed adhesive on a top surface of the PV cell from the unloading location to a cleaving system.

18. The method of claim 17 further comprising cleaving the PV cell along the scribe lines to form PV subcells.

19. The method of claim 18 further comprising bonding, by the adhesive, the cleaved PV subcells to form a super cell.

* * * * *